(12) United States Patent
Schmid et al.

(10) Patent No.: US 9,212,045 B1
(45) Date of Patent: Dec. 15, 2015

(54) MICRO MECHANICAL STRUCTURE AND METHOD FOR FABRICATING THE SAME

(71) Applicant: Infineon Technologies AG, Neubiberg (DE)

(72) Inventors: Ulrich Schmid, Vienna (AT); Tobias Frischmuth, Vienna (AT); Peter Irsigler, Obernberg/Inn (AT); Thomas Grille, Villach (AT); Daniel Maurer, Feld am See (AT); Ursula Hedenig, Villach (AT); Markus Kahn, Rangersdorf (AT); Guenter Denifl, Annenheim (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/448,783

(22) Filed: Jul. 31, 2014

(51) Int. Cl.
*H01L 29/66* (2006.01)
*B81B 3/00* (2006.01)
*B81C 1/00* (2006.01)

(52) U.S. Cl.
CPC .......... *B81B 3/0021* (2013.01); *B81B 3/0013* (2013.01); *B81B 3/0037* (2013.01); *B81C 1/00674* (2013.01); *B81B 2201/0257* (2013.01)

(58) Field of Classification Search
USPC ....................................................... 257/252
See application file for complete search history.

(56) References Cited

U.S. PATENT DOCUMENTS

| | | | |
|---|---|---|---|
| 2009/0029533 A1* | 1/2009 | Fortin et al. | 438/482 |
| 2013/0328142 A1* | 12/2013 | Nackaerts et al. | 257/415 |
| 2014/0090485 A1* | 4/2014 | Feyh et al. | 73/862.68 |
| 2014/0264650 A1* | 9/2014 | Liu et al. | 257/416 |
| 2014/0270271 A1* | 9/2014 | Dehe et al. | 381/174 |

FOREIGN PATENT DOCUMENTS

DE     102010062555 A1     6/2012

OTHER PUBLICATIONS

Frangis, N. et al., "The Formation of 3C-SiC in Crystalline Si by Carbon Implantation at 950° C. and Annealing—A Structural Study," Elsevier Science B.V., vol. 181, Issues 3, Nov. 1, 1997, pp. 218-228.
Schmid, U. et al., "Etching Characteristics and Mechanical Properties of a-SiC:H Thin Films," Elsevier Science B.V., vol. 94, Issues 1-2, Oct. 31, 2001, pp. 87-94.

* cited by examiner

*Primary Examiner* — Asok K Sarkar
(74) *Attorney, Agent, or Firm* — Slater & Matsil, L.L.P.

(57) ABSTRACT

A micro mechanical structure includes a substrate and a functional structure arranged at the substrate. The functional structure includes a functional region which is deflectable with respect to the substrate responsive to a force acting on the functional region. The functional structure further includes a conductive base layer having a conductive base layer material. The conductive base layer material includes sectionally in a stiffening section a carbon material such that a carbon concentration of the carbon material in the conductive base layer material is at least $10^{14}$ per cubic cm and at least higher by a factor of $10^3$ than in the conductive base layer material adjacent to the stiffening section.

26 Claims, 14 Drawing Sheets

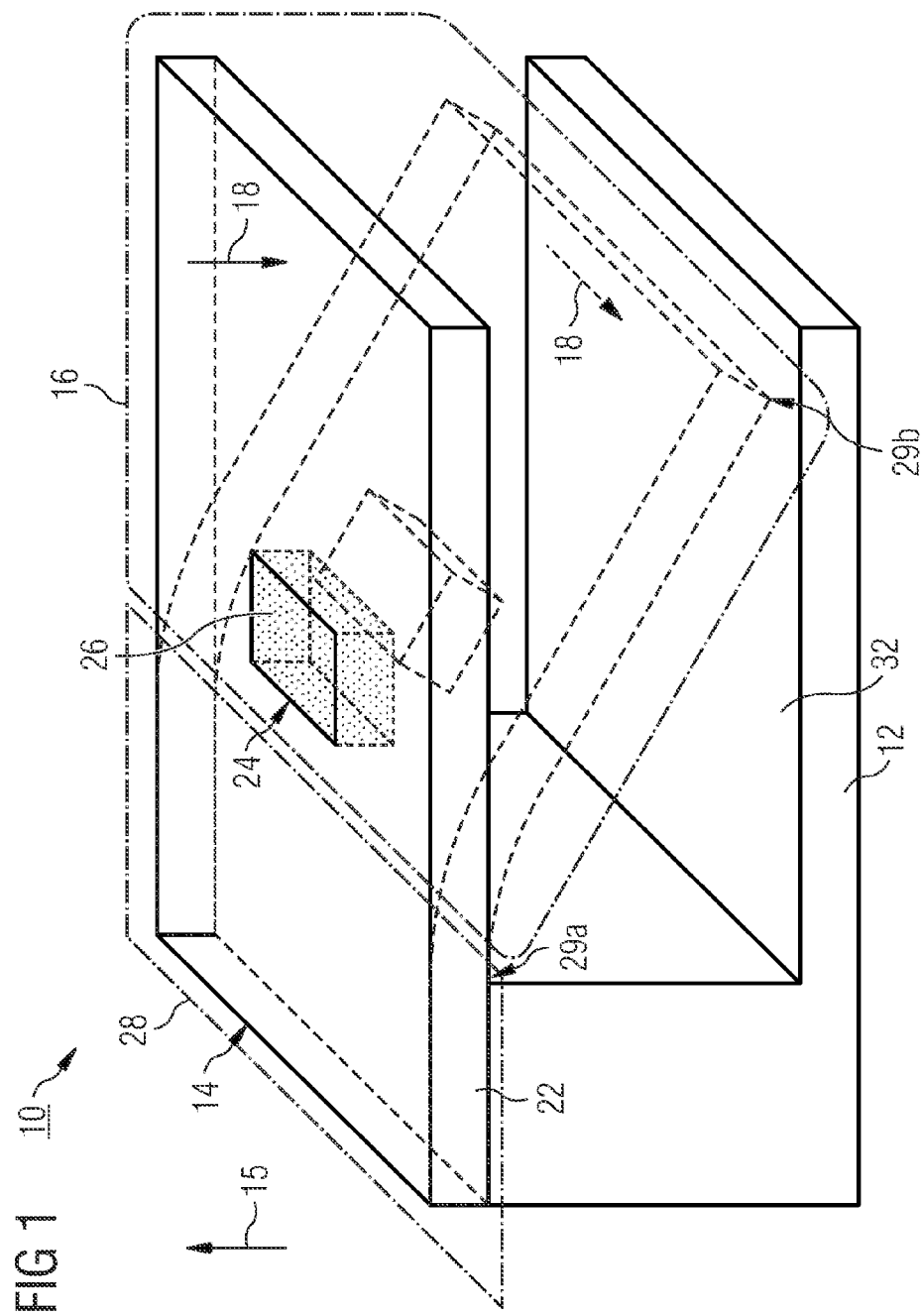

× ≙ C
△ ≙ N
○ ≙ O

MICRO MECHANICAL STRUCTURE AND METHOD FOR FABRICATING THE SAME

TECHNICAL FIELD

The invention relates to micro mechanical structures. The invention further relates to a conductive and robust micro electromechanical structure thin film via insertion of carbon, oxygen and/or nitrogen materials. The invention further relates to an insertion of carbon, oxygen and/or nitrogen materials for manufacturing of a micro and/or nano composite.

BACKGROUND

The term micro electromechanical system (MEMS) or micro mechanical system/structure is often used to refer to small integrated devices or systems that combine electrical and mechanical components. When focusing on the micro mechanical parts, the term "micro mechanical system" may be used to describe small integrated devices or systems which comprises one or more micro mechanical elements and possibly, but not necessarily, electrical components and/or electronic components.

Micro mechanical systems may be used as, for example, actuators, transducers or sensors, e.g. pressure sensors. Pressure sensors are nowadays mass products in automobile electronics and consumer goods electronics. For many of these applications, systems are used in which the sensor is integrated in an application-specific integrated circuit (ASIC). For example, Infineon Technologies AG offers such a system as a side-airbag sensor.

In particular, the mechanically active elements of a micro mechanical system may typically require relatively complex structures, such as recesses, beams, cantilevers, undercuts, cavities etc. Possibly, a relatively high number of manufacturing steps are required. Furthermore, the process used for performing the micro mechanical system may need to be compatible with possible subsequent manufacturing steps that are used for creating electrical and/or electronic components, for example.

Micro mechanical systems or structures (MMS) may comprise deflectable structures such as membranes. A Micro electromechanical structure (MEMS) may comprise one or more micro mechanical structures whose deflectable structure may be deflected electrically (actuator). Alternatively or in addition the MEMS may provide an electrical signal responsive to a deflection of the deflectable structure of the MMS (sensor). Movement of the deflected structure may lead to mechanical stress. Thus, there is a need to provide micro mechanical structures with improved durability and/or deflection performance.

SUMMARY

The inventors have found, that a durability and/or deflection performance of a micro mechanical structure may be improved when a hardness of the deflectable structure is increased locally in a section. A hardness of the deflectable structure may be sectionally increased, for example at stressed sections, by implanting sectionally a carbon material into the structure such that a loadability of the deflectable structure may be increased and/or such that a volume of thereof may be reduced.

Embodiments provide a micro mechanical structure comprising a substrate and a functional structure arranged at the substrate. The functional structure comprises a functional region which is deflectable with respect to the substrate responsive to a force acting on the functional region. The functional structure comprises a conductive base layer having a conductive base layer material. The conductive base layer material comprises sectionally in a stiffening section a carbon material such that a carbon concentration of the carbon material in the conductive base layer material is at least 1014 (1e+14) per cm3 (cubic cm) and at least higher by a factor of 103 (1e+3) than the conductive base layer material adjacent to the stiffening section.

Another embodiment provides a method for fabricating a micro mechanical structure. The method comprises providing a substrate and arranging a functional structure with a conductive base layer having a conductive base layer material at the substrate such that the functional structure is deflectable in a functional region with respect to the substrate responsive to a force acting on the functional region. The method further comprises implanting sectionally into the conductive base layer material in a stiffening section a carbon material such that a carbon concentration of the carbon material in the conductive base layer material is at least 1014 (1e+14) per cm3 (cubic cm) and at least higher by a factor of 103 (1e+3) than in a material of the conductive base layer material adjacent to the stiffening section.

BRIEF DESCRIPTION OF THE DRAWINGS

Embodiments of the present invention are described herein making reference to the appended drawings.

FIG. 1 shows a schematic respective view of a micro mechanical structure comprising a substrate and a functional structure arranged at the substrate according to an embodiment;

DETAILED DESCRIPTION OF ILLUSTRATIVE EMBODIMENTS

Figure 2A:
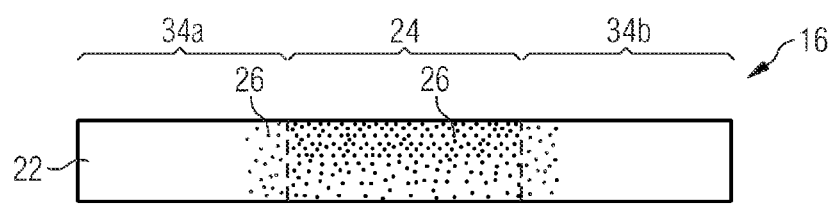
FIG. 2a shows a schematic cross-sectional view of the functional region comprising a stiffening section according to a further embodiment.

Before embodiments of the present invention will be described in detail using the accompanying figures, it is to be pointed out that the same or functionally equal elements are given the same reference numbers in the figures and that a repeated description for elements provided with the same or similar reference numbers is typically omitted. Hence, descriptions provided for elements having the same reference numbers are mutually exchangeable and applicable.

Micro electro mechanical systems (MEMS) may comprise micro mechanical systems (MMS) which may be used as actuators to deflect components thereof, for example to actuate other components. Other MMS systems may be used as a sensor and be configured to sense a mechanical deflection of parts thereof. Thus, MMS-sensors and/or actuators may comprise silicon components such as membranes that are very fragile and can easily be destroyed during handling and by mechanical shock in operation.

Sound transducers may be realized as micro electromechanical structure (MEMS). One type of sound transducers may a microphone that is configured to sense variations of sound pressure levels and/or a force generated by the variations and to provide an electrical signal representing the sensed variations. The sound pressure variations may be sensed by deflecting a membrane structure that is arranged such that an electrical field is modified by a deflection of the membrane structure, the modification measureable, for example, as variations of an electrical voltage. Another type of sound transducers may be a loudspeaker configured to generate variations of the sound pressure level responsive to a deflection of the membrane structure. The deflection may be inducted by an electrical signal generating a force, e.g., by means of an electric field. A sound transducer may be configured to operate as a microphone and/or as a loudspeaker. A MEMS sound transducer configured to operate as a microspeaker and or a microphone.

Usually, microphones and/or microspeakers realized as MEMS are manufactured in silicon technology. Silicon micromachined microphones are capacitive transducers including a flexible membrane moving in the sound field and a static perforated electrode which is called back plate. In the concept of excessive pressure, the membrane can be subjected to pressure differences up to 10 bar. In such cases, typical membranes fail since their fracture strength, respectively a maximum mechanical load the membrane may tolerate (break resistance) is exceeded.

The complementary transducer is a microspeaker that needs to be actuated such that a large stroke displacement is achieved, for example by a capacitive actuation, to drive a large air displacement and hence acceptable sound pressure.

A deflectable component of a micro mechanical structure such as a membrane of a sound transducer may be clamped, i.e., fixed at a fixed (clamped) portion and cantilevered or, i.e., vibratable or deflectable, at a deflectable portion. The membrane may thus be denoted as a cantilevered structure.

The deflectable component may be stressed mechanically during deflection. Mechanical stress may arise, for example due to material strains. For example, material stress of a cantilever beam may be maximal at an end of the cantilever beam adjacent to the clamped portion thereof. Further, mechanical stress may arise, for example, at portions of the deflectable component that abuts other components or a substrate. Such abutting portions may be located at regions or portions of the deflectable component that show high amplitudes deformation such as a deflectable end of the cantilevered beam, at regions where a distance to other components is small and/or at regions where the clamping portions ends.

Also other parameters of the deflectable components may be required to be adapted. For example, silicon comprises a conductivity for electrical currents. The conductivity may be required to be increased (less electrical resistance) or decreased (higher electrical resistance) sectionally or in total, i.e., at the complete structure.

Parameters of silicon material may be adapted by applying other materials that form a compound with the silicon material. For example, silicon material may be doped to adapt generation of holes and/or electrons.

A hardness and/or a stiffness of the silicon material may be increased by adding further materials such as carbon (C), nitrogen (N) and/or oxygen (O). The materials may be added, for example by an implantation process wherein ions of the materials are shot into the silicon. After the implantation, an annealing step may be executed such that the silicon material and the further material(s) form one or more compound materials. The silicon material and the carbon material may form a silicon carbide (SiC) material. The silicon material and the oxygen material may form a silicon oxide (SiO) material. The silicon material and the nitrogen material may form a silicon nitride (SiN) material, wherein based on process parameters a concentration value of one or more materials may vary such that in general the silicon carbide (SiC) material may obtained as $Si_xC_a$ material, such that the silicon oxide (SiO) material may be obtained as $Si_xO_b$ material, for example $SiO_2$, and/or such that the silicon nitride (SiN) material may be obtained as $Si_xN_c$ material. In addition, further materials may be obtained such as a silicon oxynitride ($Si_xO_bN_c$) material class comprising one or more $Si_xO_bN_c$ materials, a silicon carbon nitride ($Si_xC_aN_c$) material class comprising one or more $Si_xC_aN_c$ materials and/or a material class comprising one or more $Si_xC_aN_b$ materials comprising an oxygen doping ($Si_xC_aO_bN_c$). Within a material class x, a, b and/or c may comprise one or more values. A statistic distribution of x, a, b and/or c within each of the material classes may show, for example a Gaussian distribution with a center that may depend on process parameters such as a temperature, a pressure, an amount of material present (Si) or implanted (C, O, N). Different materials (C, O, N) may be implanted sequentially, one after the other or at the same time into the silicon material. If the materials are implanted sequentially, the materials may be implanted at partially or fully overlapping areas or at different areas. For example, an implantation of carbon such that SiC is formed may increase a hardness of the structure material locally in a SiC area. An implantation of oxygen such that SiO is formed may soften the structure locally within the SiC area and with respect to the SiC material and/or increase the hardness with respect to Si.

In the following, reference will be made to Si—C—O—N composites, which when taken literally stand for a compound comprising the silicon (Si) material, the carbon (C) material, the oxygen (O) material and the nitrogen (N) material. The expression Si—C—O—N shall not be limited to such a compound of materials and will be used for denoting a composite (compound) comprising silicon and at least the carbon material. The composite may further comprise optionally the oxygen material and/or the nitrogen material that may form compounds such as the above mentioned.

Effects of the mechanical stress, such as signs of fatigues (e.g., a fatigue break or a static deformation) of the deflectable component due to strains or hits/abutting may be reduced by stiffen or harden the deflectable portions at stressed regions such as strained portions or abutting portions. A hardness and/or a stiffening of materials such as silicon carbide ($Si_xC_y$), silicon nitride ($Si_xN_y$) and/or silicon oxide ($Si_xO_y$) may be increased when compared to a stiffness or hardness of silicon (Si) materials. Thus, fabricated components such as silicon membranes or silicon beams of MMS may be improved with respect to reliability and loadability.

FIG. 1 shows a schematic respective view of a micro mechanical structure 10 comprising a substrate 12 and a functional structure 14 arranged at the substrate 12. The functional structure 14 is arranged along a thickness direction 15 on the substrate 12 such that a stack is formed. The functional structure 14 comprises a functional region 16 which is deflectable with respect to the substrate 12 responsive to a force 18 acting on the functional region 16. The functional region 16 is configured to provide a mechanical active area within the functional structure. The functional structure 14 comprises a conductive base layer 22 having a conductive base layer material which may be, for example a silicon material and/or a polysilicon material. The conductive base layer 22 comprises sectionally in a stiffening section 24 a carbon material 26. A carbon concentration of the carbon material 26 in the conductive base layer 22 is at least $10^{14}$ per $cm^3$ (1e+14 per cubic cm). The carbon concentration is at least higher by a factor of 1000 ($10^3$) than in the conductive base layer material adjacent to the stiffening section 24. Sectionally refers to the stiffening section 24 only partially being arranged in the conductive base layer.

The carbon concentration in the stiffening section 24 allows for a higher hardness of the conductive base layer 22 in the stiffening section 24 when compared to sections of the conductive base layer 22 outside the stiffening section 24. The hardness of the conductive base layer 22 may vary along a lateral extend between the stiffening section 24 and regions outside thereof. The higher hardness may lead to an adaption (variation) of a bending curve of the functional region 16, when the functional region 16 deflects. The increased hardness may obstruct or attenuate deflection in the stiffening section when compared to sections outside the stiffening section 24. Alternatively or in addition, the higher hardness may allow for a reduction of material stress and/or damage when the functional region abuts other components at the stiffening section 24.

The functional structure 14 may, for example, be a bending beam, a membrane structure or a part thereof. For example, the functional region 16 may be a deflectable part or region of the bending beam or the membrane structure. A clamped region 28 of the functional structure 14, the clamped region 28 arranged adjacent to the functional region 16, may be a region of the conductive base layer 22, at which the functional structure 14 is arranged (fixed) at the substrate 12, i.e., the functional structure may mechanically fixed to the substrate 12 or be an integrally formed part of the substrate 12.

For example, the conductive base layer 22 may be arranged (deposited) by a physical vapor deposition (PVD), a chemical vapor deposition (CVD), an epitaxial growth process or a gluing process such that the conductive base layer 22 is arranged to the substrate 12 by a rigid joint, wherein at the clamped region 28 a deflection of the functional structure 14 is reduced or prevented when compared to a deflection of the functional structure 14 in the functional region 16. Afterwards, the substrate 12 may be removed partially from the conductive base layer 22, e.g., by a dry etching process, a wet edging process or a mechanical process such that a deflectable portion (i.e., the functional region 16) of the conductive base layer 22 may be exposed where the substrate 12 is removed. For example, a recess may be formed between the conductive base layer 22 and the substrate 12, the substrate 12 being mechanically fixed to the conductive base layer 22, the recess allowing for a deflection of the functional region 16. Alternatively, the substrate 12 may be arranged comprising a cavity. Afterwards, the conductive base layer 22 may be arranged such that the conductive base layer is deflectable with respect to the substrate 12 at the cavity.

The stiffening section 24 may comprise SiC that may comprise a hardness that is higher than 3, 10 or 20 GPa, wherein the hardness may be measured, for example, according to Knoop and/or Vickers. A hardness may be increased with an increasing concentration of the carbon material within the silicon material and/or by an increased temperature during annealing. The conducive base layer may comprise a silicon material. The silicon material may be a monocrystalline or a polycrystalline silicon material. The silicon material may comprise a hardness that is higher than 5, 10 or 12 GPa, wherein the hardness may depend, for example, on the structure of the crystalline structure of the material. The hardness of the silicon material and of the stiffening section material, may be varied based on process parameters such as a temperature, a pressure and/or a depositing process. The depositing process for depositing (arranging) the conductive base layer at the substrate 12 and/or the stiffening material at the conductive base layer may be, for example, a reactive physical vapor deposition (PVD), a chemical vapor deposition (CVD) process or the like, such that the conductive base layer 22 is arranged to the substrate 12 by a rigid joint, wherein at the rigid joint (clamped region) of the conductive base layer 22 a deflection of the functional structure 14 is reduced or prevented when compared to a deflection of the functional structure 14 in the functional region 16. A hardness of the stiffening section may be higher than in the conductive base layer outside the stiffening section 24 by a factor of at least 1.5, 2 or 2.5.

The conductive base layer material may comprise, for example, a silicon material. The silicon material may comprise, for example, a polysilicon material. The conductive base layer material further may comprise further materials such as a doping material, e.g., a phosphorus material, a boron material or the like. Further, the conducive base layer material may comprise the carbon material 26 outside the stiffening region 24, wherein the carbon concentration is at least higher by a factor of 1000 in the stiffening section 24 when compared to the conductive base layer material adjacent to the stiffening section 24. The higher carbon concentration may lead to an increased hardness and/or an increased stiffness of the conductive base layer 22 in the stiffening section 24. The increased hardness and/or increased stiffness may lead to a modified bending or deflection curve of the functional structure 14. For example, the deflection curve and/or the bending curve may be flattened at the stiffening section 24 when the force 18 acts at the functional region. Alternatively or in addition the increased hardness allows for an increased abrasive resistance, an increased breaking strength and/or an increased electrical capacity of conductive structures. The force 18 may be, for example, an external force such as a pressure or a variation thereof, a mechanical force and/or a force generated by an electrostatic or electrodynamic field.

To stiffen the conductive base layer 22 in the stiffening section 24 with respect to soft sections outside the stiffening section and by means of the stiffening material, the stiffening material may comprise a hardness that is at least 1.5, 2 or 2.5 than the hardness of the conductive base layer material.

As described above, the stiffening section material may further comprise at the least one of the nitrogen material and the oxygen material. The carbon concentration of the carbon material may be at least 1% and at most 100%, at least 3% and at most 80% or at least 10% at most 500% of the concentration of the silicon material of the stiffening section 24.

A nitrogen material may combine with other materials in the Si—C—O—N compound for exemplary forming silicon nitride which may allow for a further increasing of the hardness. Silicon nitride (SiN) may comprise a Young's modulus with a value, that is greater than 100 GPa, greater than 150 GPa or greater than 200 GPa. The silicon material may form, for example, silicon oxide ($SiO/SiO_2$) which may allow for a reduced (electrical) conductivity when compared to silicon material. SiO may comprise a Young's modulus with a value, that is greater than 40 GPa, greater than 70 GPa or greater than 90 GPa. $SiO/SiO_2$ may comprise a hardness with a value, that is greater than 14 GPa, greater than 16 GPa or greater than 17 GPa. The Young's modulus of the conductive base layer 22 in the stiffening section 24 may be higher than the Young's modulus of the conductive base layer 22 outside the stiffening section 24 by a factor of at least 1.5, at least 2 or at least 2.5.

The stiffening section 24 may comprise insulating properties. Alternatively, if the stiffening section 24 may comprise conductive properties. A hardness of SiO and/or SiO2 may be smaller than the hardness of SiC. This allows for a local reduction of the increased hardness in the stiffening section 24 and thus provides further degrees of freedom, for example, if the average concentration of the oxygen material is locally varied when compared to the average carbon concentration. All of the material combinations may allow for an adaption of behavior of the functional structure 14 with respect to temperature (such as expansion, deflection or pressure robustness, i.e. depending on requirements for a system comprising the micro mechanical structure 10, properties of the micro mechanical structure 10 may be adapted.

Thus, the stiffening section 24 may stiffen the conductive base layer 22 at least at regions covered by the stiffening section 24. The stiffening may lead to a changed, i.e. adapted, bending line (deflection curve) of the functional section 14, of the functional region 16 respectively. For example, the stiffening section 24 may be arranged at or adjacent to regions of the functional region 16 showing high or maximum strains during deflection such as fixing portions configured to clamp (fix) the functional structure 14 with respect to the substrate 12.

Alternatively, the stiffening section 24 may be arranged at regions of the conductive base layer 22 comprising less or even a minimum of strain when the functional structure 14 is deflected. Such a portion may be, for example, a center of a membrane of a loudspeaker or a microphone when the membrane is clamped, fixed or mounted at edge portions.

The conductive base 22 layer may comprise silicon material and may be conductive with respect to an electrical current. Alternatively, the conductive base layer 22 may comprise a high electrical resistance. The conductive base layer 22 may be conductive with respect to a thermal energy such as heat.

The stiffening section 24 may be arranged at a region or portion of the functional region 16, which is configured to abut the substrate 12. The micro mechanical structure 10 may comprise an abutting region 29a, for example, in or adjacent to a transition region between the clamped region 28 and the functional region 16, i.e., at boarders of the substrate 12 being arranged at the conductive base layer 22. Alternatively or in addition, the micro mechanical structure 10 may comprise an abutting region 29b at portions or regions of the functional region that are deflected such that the functional region 16 abuts, i.e., engages, a bottom or top region 32 of the substrate 12.

The bottom or top region 32 may be or comprise, for example, an electrode, configured to generate an electrostatic or electrodynamic field that may be adapted to generate the force 18 when the electrostatic or electrodynamic field is generated between the functional structure 14 and the bottom or top region 32. Alternatively or in addition, the force 18 may be, for example, an external pressure level that may deflect the functional region 16.

The functional structure 14 may be a membrane structure, a bending beam structure or the like. The membrane structure may be part of a sound transducing device such as a (micro) microphone or a (micro) loudspeaker. Alternatively the functional structure 14 may be a sensing element of a sensor configured to sense the deflection of the functional region 16 that may be induced by the force 18 (for example a pressure sensor) and/or an actuating structure configured to actuate other components by generating the force 18.

FIG. 2a shows a schematic cross-sectional view of the functional region 16 comprising the stiffening section 24. The conductive base layer material of the conductive base layer 22 comprises the carbon material 26 in the stiffening section 24. Adjacent to (outside) the stiffening section 24, soft regions 34a and 34b are arranged. In the soft regions 34a and 34b the carbon material may be arranged. The carbon material may be arranged in the soft regions 34a and 34b such that a carbon concentration of the carbon material 26 is at least higher by a factor of 1000 in the stiffening section 24 than in the soft regions 34a and 34b.

Figure 2B:
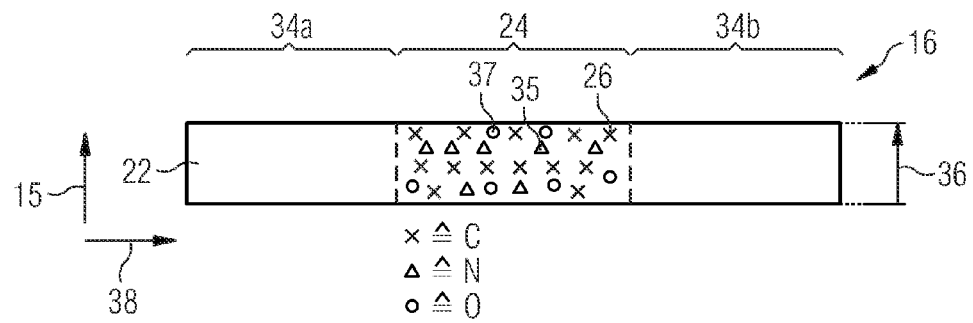
FIG. 2b shows a schematic cross-sectional view of the functional region comprising the stiffening section comprising a carbon material, a nitrogen material and an oxygen material according to a further embodiment.

FIG. 2b shows a schematic cross-sectional view of the functional region 16 comprising the stiffening section 24. In the stiffening section 24 the conductive base layer 22 comprises the carbon material 26 indicated as X-symbols that correspond to carbon (c). Further, the conductive base layer material comprises the nitrogen (N) material 35 as indicated by Δ-symbols. Further, the conductive base layer material comprises an oxygen (O) material 37 as indicated by the O-symbols.

The conductive base layer 22 comprises a height 36 along the thickness direction 15. The height 36 in the soft regions 34a and 34b may be equal to the height 36 in the stiffening section 24 within a tolerance range. For example, the carbon material 26, the nitrogen material 35 and/or the oxygen material 37 may be implanted into the conductive base layer 22 via an implantation process. The conductive base layer 22 and the stiffening section 24 may be formed integrally as an integral part, i.e., in one piece. Alternatively or in addition, the stiffening section 24 may be a part (section) of the conductive base layer that is modified by the Si—C—O—N compound. The carbon material 26, the nitrogen material 35 and/or the oxygen material 37 may be inserted (shot) into the conductive base layer material by an implantation process. A thickness of the conductive base layer 22 along the thickness direction 15 may equal a thickness of the stiffening section within a tolerance range, i.e., a thickness of the functional region in the stiffening section 24 may equal to the thickness 36 within the tolerance range. For example, when the thickness 36 comprises a value of approximately 2 micrometer, a thickness variation between the functional section 24 and the soft regions 34a and 34b may be less than 200 nanometer, less than 100 nanometers or less than 75 nanometers, i.e., a relative thickness variation may be less than 10%, less than 5% or less than 3.75%.

The implantation process may be executed sectionally such that the concentration of the carbon material 26, of the nitrogen material 35 and/or of the oxygen material 37, is different, e.g., higher, in the stiffening section 24 when compared to the soft sections 34a and 34b. Thus, a variation of the carbon material 26, of the nitrogen material 35 and/or of the oxygen material 37, may vary along a lateral direction 38 of the conductive base layer 22 arranged perpendicular with respect to the thickness direction 15. The average concentration of the carbon material may be higher than the average concentration of the nitrogen and/or the oxygen, i.e., the silicon material and the carbon material may be the dominant materials within the Si—C—O—N compound.

For example, the implantation may be executed such that the particles travel along a beam direction that comprises an angle with respect to a surface normal of the conductive base layer 22, the angle different to 0°, e.g., 45°, such that the average concentration of the stiffening material also varies along the lateral direction 38. A varying average concentration of the carbon material in the functional section along the lateral direction 38 may allow for a stiffening profile in the functional section. The average concentration may be an average value of the concentration of the carbon material 26, the nitrogen material 35 and/or the oxygen material 37 along the thickness direction or along parts thereof. A number of particles slowed during the implantation within the conductive base layer material and finally stopped such that the particles are arranged at or in the conductive base layer material may depend on the conductive base layer material a process parameters such as an acceleration voltage of the ion beam. The number of particles may decrease as the ion beam travels through the conductive base layer material, as the number of particles decreases with each particle being stopped. This may lead to a reduced number of particles along an increasing penetration depth of the ion beam and along a direction opposing or along the thickness direction. Especially in a polysilicon material a number of particles stored in the conductive base layer material may vary along the lateral direction due to material inhomogoneities. The average concentration value may refer to a number of particles arranged in a defined volume of the conductive base layer material.

The stiffening profile may allow for a more homogeneous or even continuous variation of the hardness and/or the stiffness at boarders between the soft regions 34a and/or 34b and the functional section 24.

The variation of the respective concentration along the lateral direction 38 may be achieved, for example, by guiding an ion beam during the implantation process, the ion beam configured to implant the carbon material 26, the nitrogen material 35 and/or the oxygen material 37.

Alternatively, during processing, the conductive base layer 22 may be covered partially by a shielding layer, for example a sacrificial layer that may be removed after the implantation. The implantation may be performed partially or completely with respect to a surface of the conductive base layer 22, wherein the shielding layer may be configured to prevent the carbon material 26, the nitrogen material 35 and/or the oxygen material 37 from being implanted into the conductive base layer material. Alternatively, the shielding layer may at least reduce an amount or dose of the respective material being implanted to the conductive base layer material. The implantation may be repeated with different shielding layers such that each of the material concentration may vary independently from each other along any direction of the conductive base layer and such that different properties of the stiffening section, such as hardness, a locally softening and/or a conductivity may be implemented independently from each other along any direction of the conductive base layer 22.

After the implantation, the conductive base layer material may be annealed such that a crystal lattice of the conductive base layer 22 that is distorted by the implanted particles is restored. The annealing may be performed, for example at annealing temperatures that may be above 500° C., above 700° C. or above 900° C. and/or below 1300° C., 1250° C. or below 1200° C.

Each of the carbon material 26, the nitrogen material 35 and the oxygen material 37 comprises a respective material concentration. A total concentration of the stiffening material comprising the carbon material 26, the nitrogen material 35 and the oxygen material 37 may be, for example, higher than $10^{10}$ and less than $10^{30}$ particles per cubic cm. Alternatively, the average concentration of the stiffening material may be between $10^{12}$ and $10^{28}$ particles per cubic cm or between $10^{14}$ and $10^{24}$ particles per cubic cm. An implantation dose for obtaining above mentioned concentrations may comprise a value that is, for example, higher than $10^7$ per $cm^2$ and less than $10^{25}$ per $cm^2$ or higher than $10^{11}$ and less than $10^{21}$ $cm^2$, wherein an implantation dose of, for example, $10^8$ particles per square cm may lead to a concentration of the stiffening material of $10^{11}$ particles per cubic cm. A concentration of the carbon material being equal to the concentration of the silicon material may allow for a so called stoichiometric silicon carbide. The concentration of the carbon material being higher than the concentration of the silicon material may allow for a diamond-like carbon that may be doped with the silicon material.

Alternatively, only the carbon material 26 may be arranged at the stiffening section 24. Alternatively, only one of the nitrogen material 35 or the oxygen material 37 may be arranged in addition to the carbon material 26.

The implantation process may be executed such that the concentration of the stiffening material varies along the direction along which the implantation is executed. For example, if during the implantation the particles travel along the thickness direction 15, a concentration of the carbon material 26, the nitrogen material 35 and/or the oxygen material 37 and thus of the stiffening material may vary, i.e., decrease or increase along the thickness direction.

The stiffening section 24 may provide an increased hardness of the conductive base layer and thus of the functional region. The increased hardness may allow for an enforcement of the functional region 16 in critical regions such as abutting regions.

The stiffening section 24 may further allow for an increased mechanical robustness and/or for an increased conductivity of the conductive base layer 22. The increased mechanical robustness may allow for a material saving when compared to a conductive base layer only comprising (poly) silicon material, wherein the more robust functional structure 14 allows for a less amount of material comprising the same robustness. The stiffening section 24 may allow for a reduced thickness or reduced other dimensions such that a mass of the functional region may be reduced. A reduced thickness and/or a reduced mass may allow for an increased production capacity of production plants producing the micro mechanical structures, for example, due to reduced time intervals required to grow or deposit silicon or polysilicon materials at wafers.

The carbon material may form a silicon carbide (SiC)-material which allow for water repelling and/or hydrophobic characteristics of the functional region such that effects of, for example, air humidity on the micro mechanical structure may be reduced. A partial or sectionally inclusion or implantation of the functional section may further allow for different structural designs that may comprise new characteristics of material with respect to micro mechanical structures and/or micro electromechanical structures such as membranes, cantilever beams or the like.

FIGS. 3a-i show each a schematic top or bottom view of a possible implementation of the functional region 16. The functional region 16 comprises exemplarily a base area with a round shape. In the functional region 16 at least one functional section is arranged at the conductive base layer 22. The functional region 16, the conductive base layers 22, respectively, are depicted as having a round circular shape. A round shape may be advantageous when the functional region 16 is at least a part of a deflectable membrane. Alternatively, the functional region 16 and/or the conductive base layer 22 may comprise a different shape, for example an elliptical shape or a polygon shape. Alternatively, the functional region 16 and/or the conductive base layer 22 may be formed as a convex or concave formed curve.

Figure 3A:
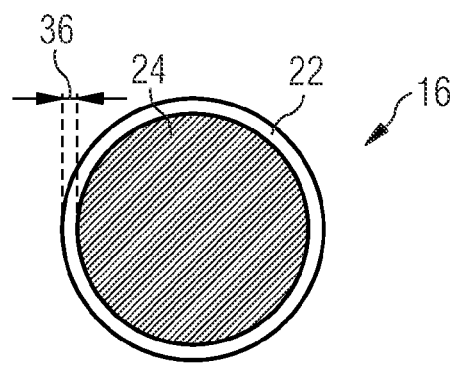
FIGS. 3a-i show each a schematic top or bottom view of a possible implementation of the functional region according to further embodiments according to an embodiment.

With respect to FIG. 3a, the functional structure 24 covers the conductive base layer 22 with the exception of an edge portion 36 of the conductive base layer 22. For example, a surface of the conductive base layer 22 covered by the functional structure 24 may be covered more than 90%, more than 95% or more than 99%.

Figure 3B:
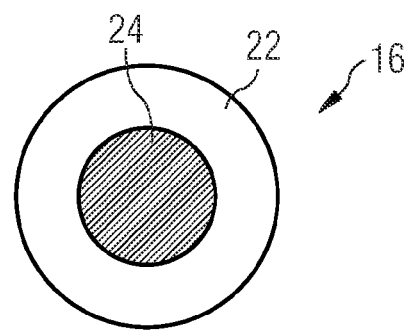

With respect to FIG. 3b, the functional structure 24 comprises a round shape and is arranged at a center of the conductive base layer 22 such that the functional section 24 is arranged concentric with respect to the conductive base layer. A diameter of the functional section may be, for example at least 1%, at least 20% or at least 50% of a diameter of the conductive base layer, wherein the diameter may also refer to a longest and/or shortest extension of the base area of the conductive base layer 22 when the same comprises a non-circular shape.

Figure 3C:
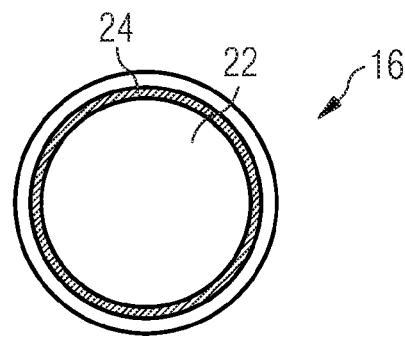

With respect to FIG. 3c, the functional structure 24 comprises a ring shape that is arranged concentric with respect to a base area the conductive base layer 22. Alternatively, a center of the functional 24 may be arranged at a different position of the conductive base layer 22, such that the functional section 24 is not concentric with respect to the center of conductive base layer 22.

Figure 3D:
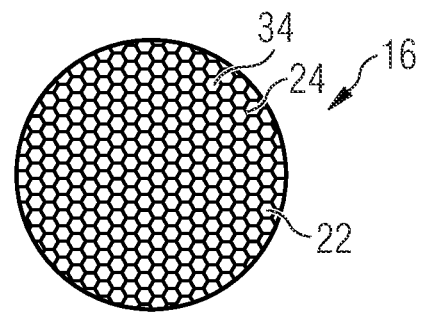

With respect to FIG. 3d, the conductive base layer 24 comprises a honeycomb structure comprising a plurality of honeycombs. The honeycomb structure totally covers the conductive base layer 22, wherein according to alternative embodiments it may cover the conductive base layer 22 only partially. An inner region of one, more or all of the honeycombs is formed as a recess 34 such that the conductive base layer 22 is uncovered by the functional section material at the recesses 34. The recess 34 may have a polygon shape such as a hexagon shape.

A honeycomb formed functional section 24 may lead to a high stiffness of the functional regions 16 as honeycomb structures may provide a high robustness against exerted forces. Implementing the functional section sectionally allows for an increased or optimized load capacity with respect to mechanical stress by inserting the functional section into the conductive base layer.

Figure 3E:
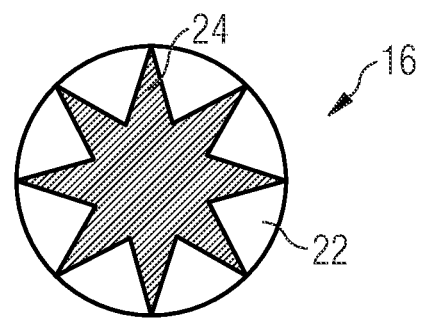

With respect to FIG. 3e, the functional section 24 comprises a star shape extending from the center to an outer circumference of the conductive base layer 22. For example, the functional region 16 may be clamped or mounted to the substrate at ends (beams or rays) of the star shape or at regions of the conductive base layer 22 that are between the ends of the star shape.

Figure 3F:
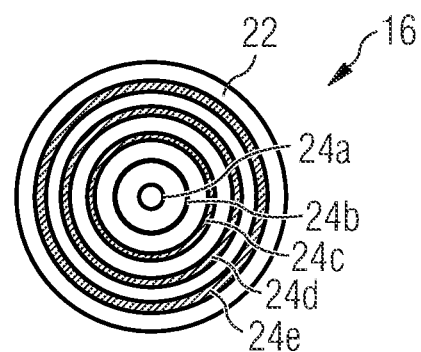

With respect to FIG. 3f, the conductive base layer 22 is partially covered by a plurality of functional sections 24a-e. Each of the functional sections 24a-e is formed as a ring structure comprising a diameter, a broadness of the respective ring and radius different from each other and arranged concentrically with respect to each other and to the center of the conductive base layer 22. Thus, the functional sections a-e form a multi-ring structure. Alternatively, one or more rings may comprise an equal broadness.

Figure 3G:
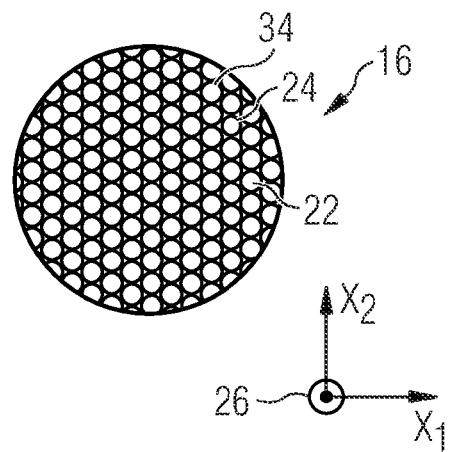

With respect to FIG. 3g, the functional section is formed similar to the functional section shown in FIG. 3d with the exception that the recesses 34 are formed as circles. This may lead to a varying extent of the material of the functional section 24 along a first and/or second lateral direction (x1 and/or x2) arranged perpendicular to the thickness direction 26. At connection points 37 between two or more recesses 34 the extent along the first lateral direction x1 and/or the second lateral direction x2 may be higher, resulting in a higher amount of functional section material at those points. This may lead to a higher stability of the functional section 24.

Figure 3H:
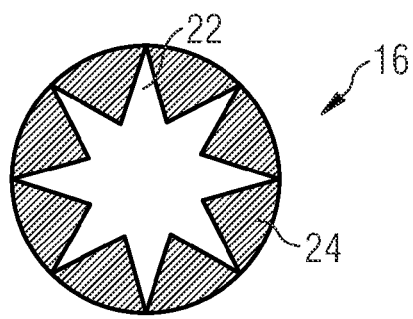

With respect to FIG. 3h, the functional section 24 comprises an inverse star shape when compared to the star shape depicted in FIG. 3e. The functional section 24 partially covers the conductive base layer 22, sparing an inner star-shaped region.

Although the star shapes shown in FIGS. 5e and 5h are depicted as extending from the center of the conductive base layer 22 to the outer region, the star shapes may alternatively only extend to a value of less than 50%, less than 75% or less than 95% of the radius or extend along the first and/or second lateral direction x1, x2 of the conductive base layer 22.

Figure 3I:
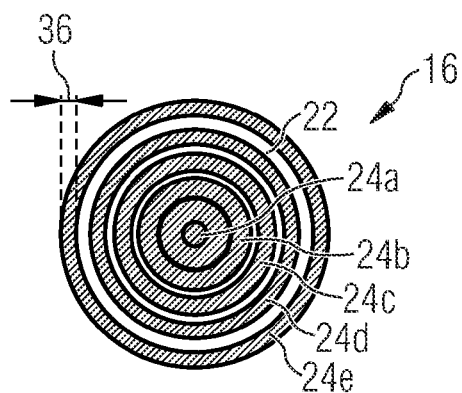

With respect to FIG. 3i, the functional sections 24a-e are arranged at an inverse multi-ring shape at the conductive base layer 22 when compared to the functional sections 24a-e depicted in FIG. 3f. When compared to the functional structures 24a-d shown in FIG. 3f, the functional structures 24a-e shown in FIG. 3i may be arranged such that the outer region 36 and the center of the conductive base layer 22 are covered by the functional structures 24a-e, wherein in FIG. 3f, a comparable outer region 36 and the center are spared by the functional structures 24a-e.

Figure 4A:
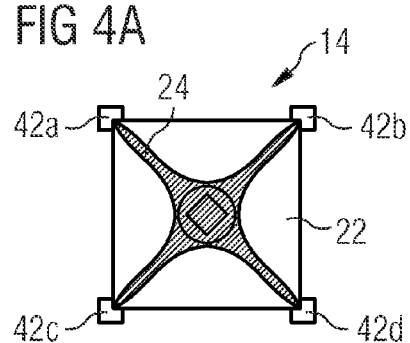
FIGS. 4a-p show each a schematic top or bottom view of a functional structures comprising a quadratic conductive base layer that is clamped at clamping regions according to embodiments according to a further embodiment.
Figure 4B:
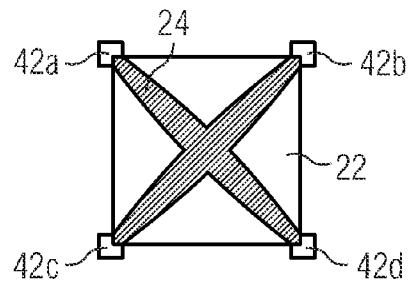
Figure 4C:
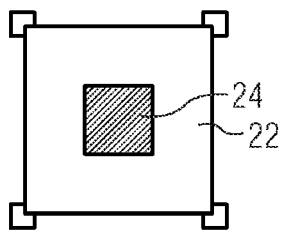
Figure 4D:
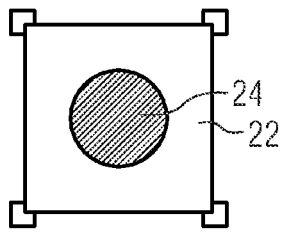
Figure 4E:
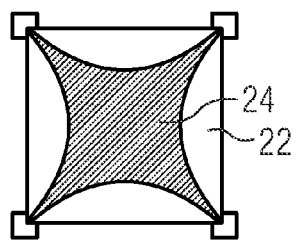
Figure 4F:
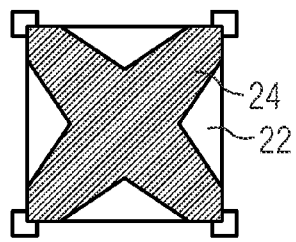
Figure 4G:
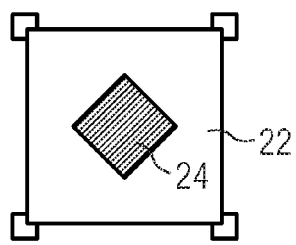
Figure 4H:
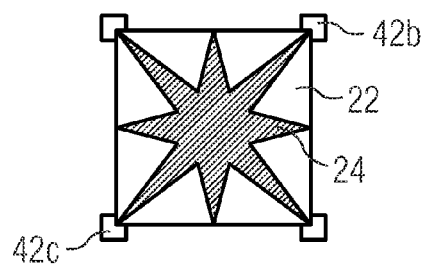
Figure 4I:
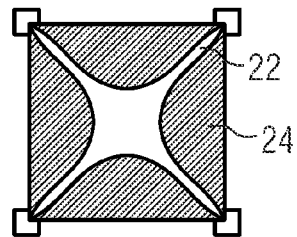
Figure 4J:
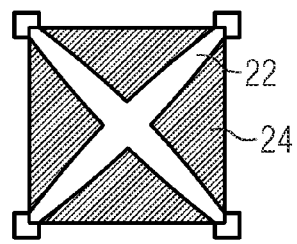
Figure 4K:
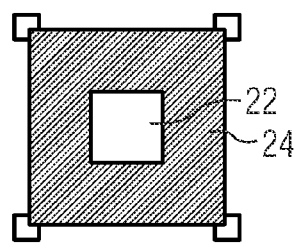
Figure 4L:
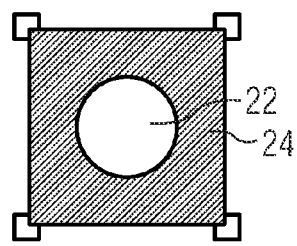
Figure 4M:
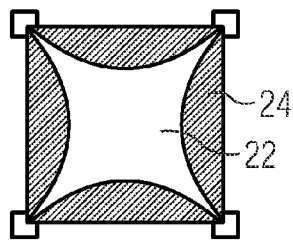
Figure 4N:
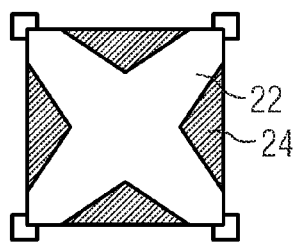
Figure 4O:
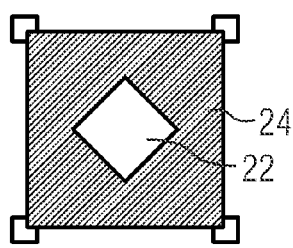
Figure 4P:
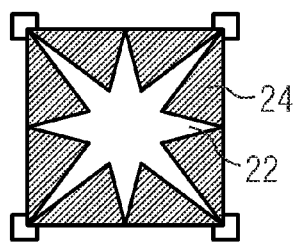
Figure 6A:
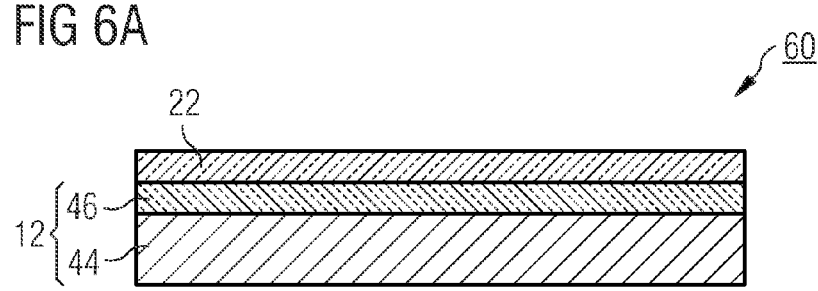
FIG. 6a shows a schematic cross-sectional view of a micro mechanical structure that may be, for example, an intermediate product during manufacturing the micro mechanical structure depicted in FIG. 1 according to a further embodiment.

FIGS. 4a-p show schematic top or bottom views of functional structures 14 comprising a quadratic conductive base layer 22 that is clamped at clamping regions 42a-d. The functional structure 14 may be, for example, a membrane of a sound transducing device, for example, a microphone or a loudspeaker. Although FIGS. 6a-p depict the conductive base layer being formed quadratic, the conductive base layer 22 may comprise other shapes, such as a round, an elliptical, a polygon shape or a combination thereof.

With respect to FIG. 4a, the functional section 24 comprises a shape that may be obtained by an overlay of two elliptical structures being diagonally arranged between the clamping regions 42a and 42d, between the clamping regions 42b and 42c, respectively. In center portions where the two elliptical structures overlap, a circular structure may be arranged. Thus, the shape of the functional section 24 may be obtained by overlapping two or more geometrical structures or shapes.

With respect to FIG. 4b a shape of the functional section 24 may be obtained by overlapping two elliptical structures that are arranged diagonally at the conductive base layer 22 between two diagonally arranged clamping regions 42a-d, i.e., between the clamping regions 42a and 42d and between the clamping regions 42b and 42c.

With respect to FIG. 4c, the functional section 24 comprises a shape that is geometrical similar to the shape of the conductive base layer 22, such that the functional section 24 is formed quadratic with an edge length smaller than a corresponding edge length of the conductive base layer 22, wherein the edges of the conductive base layer and the edges of the functional section 24 are essentially parallel to each other. The functional section 24 is arranged at the center of the conductive base layer 22.

With respect to FIG. 4d, the functional section 24 comprise a round shape, wherein a center of the functional section 24 overlaps with a center of the conductive base layer 22.

With respect to FIG. 4e, the functional section 24 comprises a shape that may be obtained by sparing shape regions of the conductive base layer 22 that may be formed by circles or one or more ellipses or parts of them, wherein for example a center of a circle or a special point of an ellipse is arranged outside the surface of the conductive base layer 22.

With respect to FIG. 4f, the functional section 24 comprises a shape that may be obtained by overlapping two diagonally arranged ellipses, wherein the ellipses comprise an increased conjugate diameter when compared to the ellipses shown in FIG. 4b. The ellipses are projected only partially into the surface of the conductive base layer 22 such that the functional section 24 comprises only parts of the ellipses.

With respect to FIG. 4g, the functional section 24 comprises a shape that is geometrically similar to the shape of the conductive base layer 22, wherein the shape of the functional section 24 is rotated when compared to FIG. 4c, e.g. it is rotated by an angle of 45°. Alternatively, the functional section 24 may be rotated by any other angle, such as in a range between 0° and 360°, 0° and 180° or between 0° and 90°.

With respect to FIG. 4h, the functional section 24 comprises a star shaped surface. The star shaped surface may be obtained, for example, by a circular shape and four elliptical shapes that are rotated by an angle, such as 45° to each other, wherein one elliptical shape may be arranged diagonally on the conductive base layer 22.

With respect to FIG. 4i the functional section 24 shows an inverse shape when compared to the functional section shown in FIG. 4a. Inversed means that regions of the conductive base layer 22 that are covered in a first shape by the functional section are spared by the inversed functional section and vice versa.

With respect to FIG. 4j, the functional section 24 comprises a shape that is inversed to the shape of the functional section shown in FIG. 4b.

With respect to FIG. 4k, the functional section 24 comprises a shape that is inversed when compared to the shape of the functional section depicted in FIG. 4c.

With respect to FIG. 4l, the functional section 24 comprises a shape that is inversed to the shape of the functional section depicted in FIG. 4d.

With respect to FIG. 4m the functional section 24 comprises a shape that is inversed to the shape of the functional section 24 depicted in FIG. 4e.

With respect to FIG. 4n, the functional section 24 comprises a shape that is inversed to the shape of the functional section 24 depicted in FIG. 4f.

With respect to FIG. 4o, the functional section 24 comprises a shape that is inversed to the shape of the functional section 24 depicted in FIG. 4g.

With respect to FIG. 4p, the functional section 24 comprises a shape that is inversed to the shape of the functional section 24 depicted in FIG. 4h.

A base area of the functional section 24 may comprise at least a part of a circular shape, a star shape, a polygon shape, an elliptical shape, a honeycomb structure, any other shape and/or a combination thereof.

Figure 5:
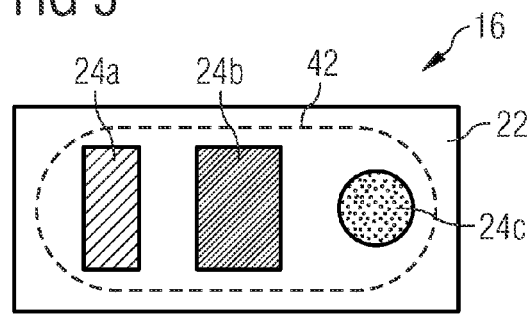
FIG. 5 shows a schematic top view on the functional region having three functional sections in a stiffening region of the functional region according to a further embodiment.

FIG. 5 shows a schematic top view on the functional region 16. The conductive base layer 22 comprises three functional sections 24a, 24b and 24c in a stiffening region 42 of the functional region 16. An average concentration of the carbon material in the stiffening section 24a is different from an average concentration of the carbon material in the stiffening section 24b and different from an average concentration of the carbon material in the stiffening section 24c such that the average concentration of the carbon material in the conductive base layer material varies with the plurality of functional sections 24a-c. This may allow for achieving a result in a stiffening profile in the stiffening region 42. This may allow for adapting and/or modifying, for example, the bending curve of the functional region 16 when being deflected. In addition, the stiffening sections 24a-c may also comprise a varying average concentration of the nitrogen material and/or of the oxygen material.

FIG. 6a shows a schematic cross-sectional view of a micro mechanical structure 60 that may be, for example, an intermediate product or structure during manufacturing the micro mechanical structure 10. The substrate 12 comprises a silicon layer 44 that may comprise, for example, polysilicon material. The silicon layer 44 is covered by a dielectric layer 46 at a first main surface. Both, the silicon layer 44 and the dielectric layer 46 form the substrate 12.

The conductive base layer 22 is arranged at a first main surface of the dielectric layer 46 opposing a second side facing the silicon layer 44. The conductive base layer 22 may be arranged, for example, by an epitactic growth process, a chemical vapor deposition (CVD), a low pressure CVD (LPCVD), a physical vapor deposition (PVD), a plasma enhanced CVD (PECVD) process or the like.

Figure 6B:
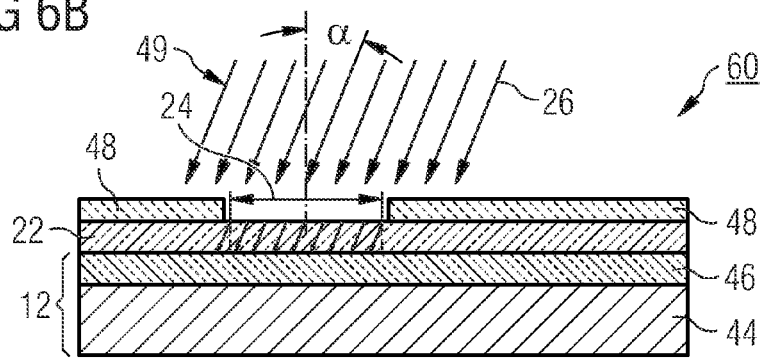
FIG. 6b shows a schematic cross-sectional view of the micro mechanical structure shown in FIG. 6b after a shielding layer has been arranged at the conductive base layer according to a further embodiment.

FIG. 6b shows a schematic cross-sectional view of the micro mechanical structure 60 after a shielding layer 48 has been arranged at the conductive base layer 22 at a side opposing a side facing the substrate 12. The carbon material 26 and optionally the nitrogen material and/or the oxygen material are implanted into the conductive base layer 22 in the stiffening section 24. The carbon material 26 may be inserted into the conductive base layer 22 at an oblique angle $\alpha$. The oblique angle $\alpha$ may comprise a value between 0° and 90°, wherein an angle of smaller than 60° or even smaller or equal than 45° may be of advantage.

The shielding layer 48 is arranged at the conductive base layer 22 and configured to prevent the carbon material 26 from being inserted into the conductive base layer 22 shadowed by the shielding layer 48 for an ion beam 49 configured to inject the one or more materials of the Si—C—O—N compound. Alternatively or in addition, the implantation may be executed with a focused beam 49 comprising the particles such that arranging the shielding layer 48 may be skipped. The implantation may be repeated sequentially one after the other or in parallel with different materials injected and/or at different regions of the conductive base layer 22.

Figure 6C:
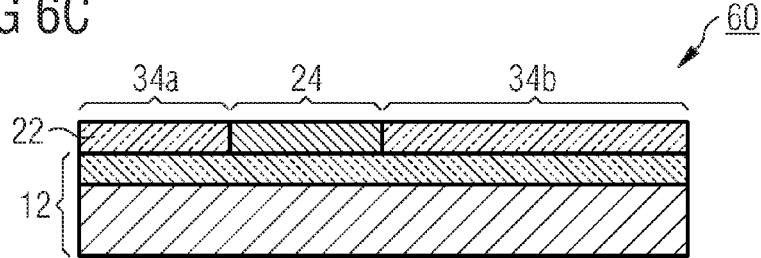
FIG. 6c shows a schematic cross-sectional view of the micro mechanical structure shown in FIG. 6b after the shielding layer is removed and after the micro mechanical structure is annealed according to a further embodiment.

FIG. 6c shows a schematic cross-sectional view of the micro mechanical structure 60 after the shielding layer 48 is removed and after the micro mechanical structure 60 is annealed. A crystalline lattice structure may be restored such that a hardness of the conductive base layer material is increased based on the restored and modified crystalline lattice structure in the stiffening section 24 with respect to the soft regions 36a and 36b.

Figure 7A:
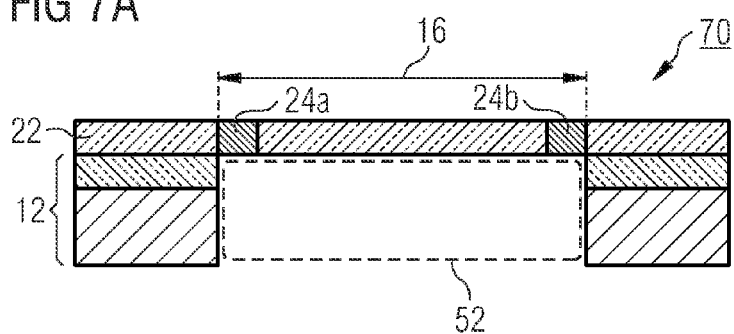
FIG. 7a shows a schematic cross-sectional view of a micro mechanical structure that may be obtained, for example, by further processing the micro mechanical structure shown in FIG. 6c according to a further embodiment.

FIG. 7a shows a schematic cross-sectional view of a micro mechanical structure 70 that may be obtained, for example, by further processing the micro mechanical structure 60. The micro mechanical 70 comprises a recess 52 exposing the conductive base layer partially in the function region 16, such that the conductive base layer 22 is deflectable in the functional region 16. The structures 24a and 24b may overcome an increased mechanical stress due to a deflection of the functional structure with respect to the substrate 12. The conductive base layer 22 may be configured to act as a membrane. The micro mechanical structure 70 may be arranged, for example, in a micro mechanical sound transducer that may be, for example, a microphone or a loudspeaker.

Figure 7B:
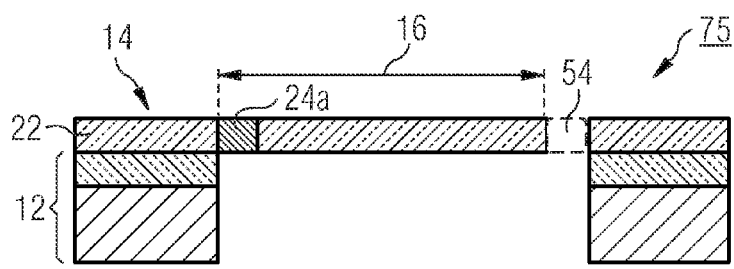
FIG. 7b shows a schematic cross-sectional view of a micro mechanical structure that may be obtained, for example, by further processing the micro mechanical structure shown in FIG. 7a according to a further embodiment.

FIG. 7b shows a schematic cross-sectional view of a micro mechanical structure 75 that may be obtained, for example, by further processing the micro mechanical structure 60 or the micro mechanical structure 70. When compared to the micro mechanical structure 60, the micro mechanical structure 75 further comprises a recess 54 such that the functional region 16 may be deflected as a bending beam that is cantilevered at the clamped region 14 and deflectable at the deflectable functional region 16.

Figure 8:
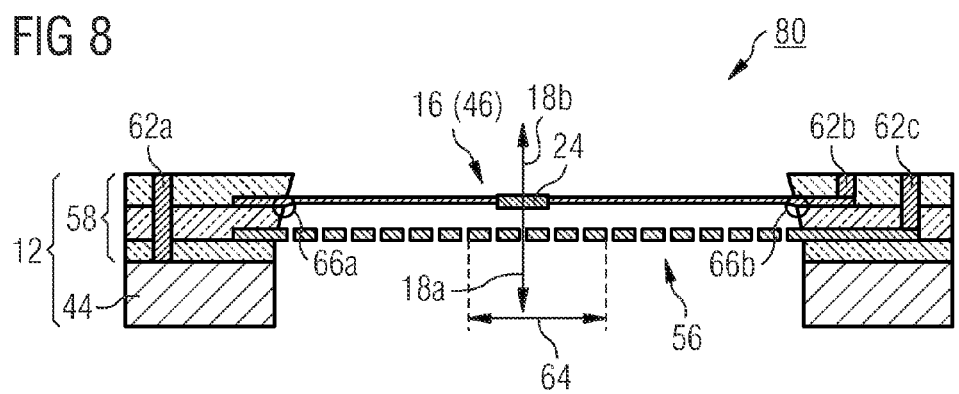
FIG. 8 shows a schematic cross-sectional view of a micro mechanical structure comprising the functional structure and a back plate electrode according to a further embodiment.

FIG. 8 shows a schematic cross-sectional view of a micro mechanical structure 80 comprising the functional structure 14 and a back plate electrode 54. The back plate electrode 54 may be part of the substrate 12. The substrate 12 comprises a base layer 56. The base layer 56 may be, for example, formed by a silicon wafer. At the base layer 56, a multilayer structure 58 is arranged. The multilayer structure 58 may comprise, for example, a Tetraethyl orthosilicate (TEOS) layer or stack. The micro mechanical structure 80 comprises contacts 62a-c that may comprise a gold material, a copper material or any other conductive material.

The contacts 62a-c are formed as vias and configured to interfuse the base layer 56 (contact 62a), the functional structure 14 (contact 62b), the back plate 54 (contact 62c), respectively. The back plate 54 may be formed, for example, by a polysilicon material. Thus, an electrical voltage may be applied to the functional structure 14, the back plate 54 and/or the base layer 56.

By applying a voltage between the contacts 62b and 62c, an attraction force 18a may be generated between the back plate 54 and the functional structure 12, when the functional structure 14 and the back plate 54 are charged with a charge of different polarity. When the functional structure 14 and the back plate 54 are charged with a charge of equal polarity, a repelling force 18b may be generated between the back plate 54 and the functional structure 14.

The functional structure 14 may be configured to abut the back plate 54 at an abutting region 64 of the back plate 54. The functional structure 46 may be configured to abut the substrate 12 at abutting portions 66a and 66b of the substrate 12 where the substrate 12 starts and/or stops clamping the functional structure 46. Alternatively, the back plate 54 may be a part of the substrate 12, such that the functional structure 46 is configured to abut the substrate 12 at the abutting region 64.

The micro mechanical structure 80 may be configured to operate as a sound transducer. The functional structure 46 may thus be a membrane structure configured to emit sound pressure levels and therefore sound when the micro mechanical structure is part of a loudspeaker.

Alternatively, an external force, such as a sound pressure level, may induce the attraction force 18a and/or the repelling force 18b such that an electrical signal may be acquired at the contacts 62b and 62c. For example, the micro mechanical structure 80 may be part of a microphone structure.

The functional section comprised by the functional structure 14 may thus be configured set sound transducing characteristics of the micro mechanical structure as a variation of the Young's Modulus and/or the hardness may be configured to adapt a bending curve of the functional structure 14 and thus may adapt the electrical signal being acquired at the contacts 62b and 62c or of the sound being emitted by a loudspeaker.

Alternatively or in addition, the micro mechanical structure 80 may comprise one or more further functional sections 24 and/or further functional structures. One or more functional structures 14 may be arranged, for example, at a side of the back plate 54 opposing the functional structure 14 such that two functional structures are arranged, sandwiching the back plate 54, wherein both functional structures are configured to deflect responsive to the force 18a and/or the force 18b acting on the respective functional structure.

An advantage of the functional structures 14 is that in contrast to known concepts a voltage, at which a membrane structure may be excited to vibrate may, as far as the process is concerned, may be controlled by means of the material concentration instead of only by the implantation dose and the temperature.

In other words, when introducing C/N/O and/or other materials, an additional degree of freedom may be achieved for manufacturing. For example, an operating voltage or a voltage of the microphone signal in a MEMS microphone may be adjusted, for example. One idea of the invention is applying a layer and/or a layer system containing Si—C—O—N onto microtechnologically manufactured structures in order to improve the electrical and mechanical characteristics thereof.

Basically, there may be two fundamental approaches for integrating the Si—C and/or further materials into the manufacturing process in situ, i.e. while depositing. Within the approaches, in turn, there are different types of arrangements, which are discussed above.

The layers and/or the layer systems described above may be manufactured, for example, by means of conventional processes of deposition such as reactive PVD, CVD, or the like.

Figure 12:
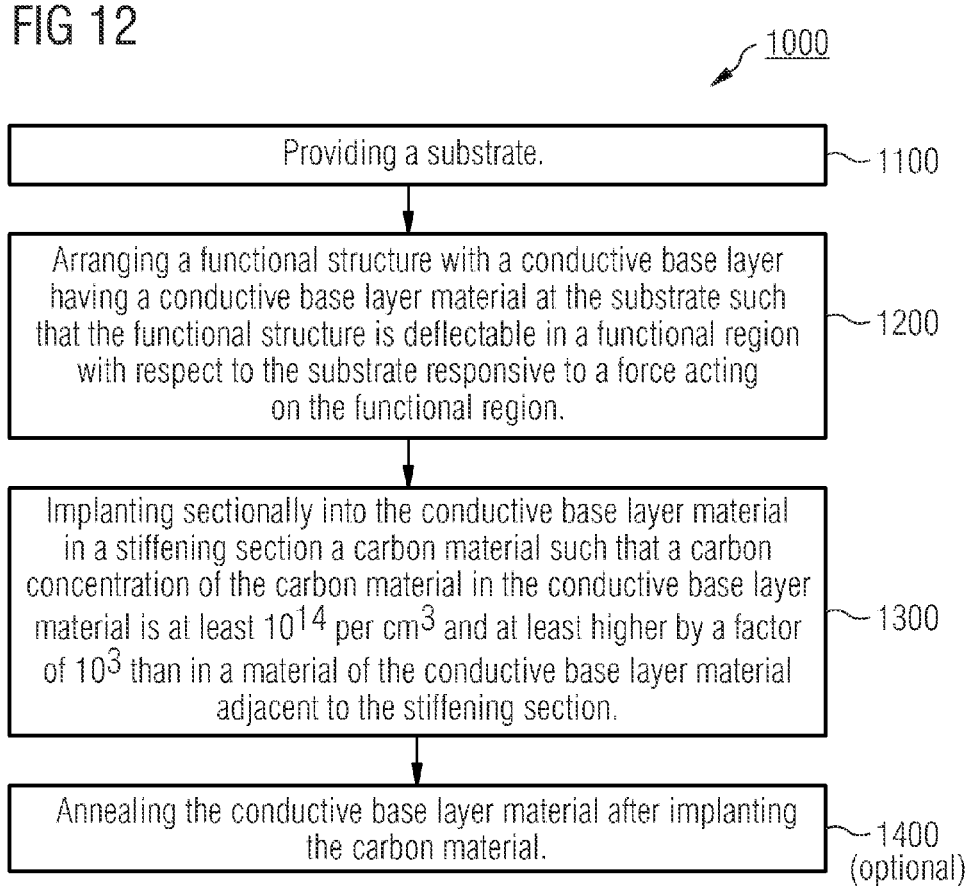
FIG. 12 shows a schematic flow chart of a method for fabricating a micro mechanical structure according to a further embodiment.

With respect to the functional structure 46, another way of applying layers may be using a gradient membrane containing silicon, the carbon material, the oxygen material and/or the nitrogen material or a variety of layers as described above, which allows varying the material concentration content over the layer thickness step by step or continuously. This may allow for adjusting the characteristic of the layer even more specifically. A rough plot of this method of manufacturing is shown in FIG. 12. The principle of deposition and achievable advantages in a gradient membrane containing the silicon and the carbon, the oxygen and/or the nitrogen material may be similar to a multilayer membrane such as it is described for the functional structure 14.

A relative position of the functional structure 46 with respect to the back plate electrode 54 may be varied. Depending on whether the membrane is operated above, in the center of or below the counter electrode arranged at the back plate 54 for example, different characteristics are regards pressure stability may be achieved. Influencing the characteristics of the system of the deposition is granted a further degree of freedom when compared to existing material layers which, up to now, could only be controlled by implantation and the temperature budget. Both the functional structure 14 and the functional structure 46 allow to make use of the advantages of a Si—C material and/or a potential layer setup made up of a combination of thin films containing Si—C—O—N in MMS and/or MEMS elements and thus developing an advantage with respect to known concepts.

Using the layers and/or gradient membranes as they are described may allow for increasing the resistance and/or the stability of conductive detached structures, such as, for example, membranes or bending beams. Additionally, an improvement of anti-sticking characteristics (caused by the lower wettability of carbon) may be achieved, which may, among other things, result in different, novel and easier setups of the entire device. This may allow for sparing further protective layers such as silicon nitride (SNIT) or intermediate oxide layers.

In known poly-Si membranes, as are used for MEMS elements, in particular in D-sound devices, decisive trials of stability, such as drop and pressure tests, are usual. A known Si microphone may have a limit at a pressure difference of roughly 2 bar. An increased robustness may allow for, on the one hand, increasing the stressability—with a constant membrane thickness—and, on the other hand, reducing the membrane thickness, and thus the vibrating mass in the device, which may result in an improvement in response and additionally in an increase of the SNR. Known polysilicon layers may comprise a thickness of, for example, between 330 nm to 2 µm and may comprise special designs trying to improve stressability effects of membrane structures. By varying the stiffness and/or the hardness of a stiffening section, the temperature characteristics of the additionally applied layers containing the Si—C—O—N materials may also be used for adjusting the voltage.

Further, a maximum pressure load, that is in known concepts at roughly 2 bar, may be increased. The stiffening section 24 is configured to abut the back plate 56 which may be part of the substrate 12.

Figure 9A:
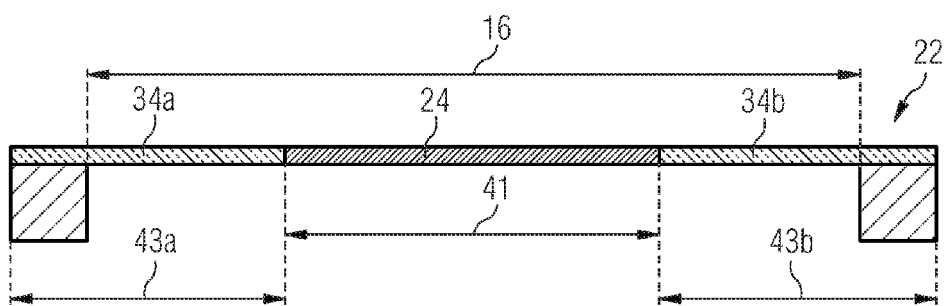
FIG. 9a shows a schematic side view of the stiffening section being arranged in an inner region of the conductive base layer according to a further embodiment.

FIG. 9a shows a schematic side view of the stiffening section 24 being arranged in an inner region 41 of the conductive base layer 22. The functional region 16 comprises the inner region 41 and the two outer regions 43a and 43b, wherein the functional structure may be, for example, a beam structure that is clamped (fixed) at both ends to the substrate 12. An outer region 43a and 43b comprises a lower concentration of the carbon material at least by a factor of 1000.

Figure 9B:
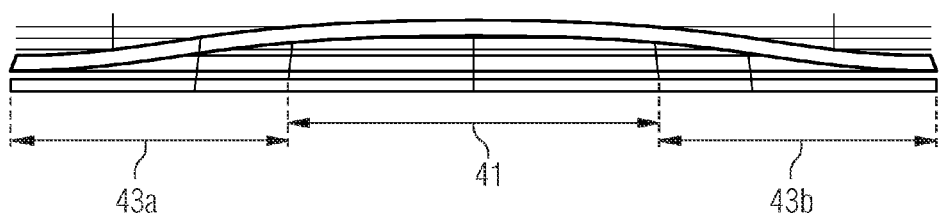
FIG. 9b shows a schematic perspective view of a simulation result simulating the bending curve that may be obtained by the functional region of FIG. 9a, when the functional region is deflected according to a further embodiment.

FIG. 9b shows a schematic perspective view of a simulation result simulating the bending curve that may be obtained by the functional region 16 of FIG. 9a, when the functional region 16 is deflected. Based on the stiffening section 24 a bending curve of the functional region 16 is flattened along the inner region 41. Based on the flattened bending curve, the deflection of the functional region 16 may be more homogeneous along the inner region 41 when compared to a bending curve of a comparable bending beam that misses the stiffening section. For example, when the functional region 16 is a membrane of a loudspeaker or a microphone, a homogenous deflection of the functional region 16 at the inner region 41 may lead to a more efficient sound transducing, i.e. sound generating or sound capturing. For example, a moved air volume of a loudspeaker membrane may be increased. As digital loudspeakers may operate by deflecting the membrane until it abuts a substrate or an electrode, the deflection may be performed more efficiently. In addition, the membrane may abut the substrate or the electrode at regions where the stiffening section is arranged, such that damage of the membrane caused by abutting the substrate or the electrode may be reduced or prevented.

Figure 10A:
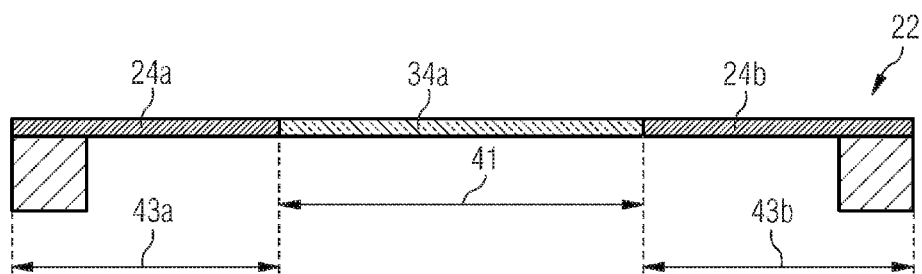
FIG. 10a shows a schematic side view of the stiffening sections being arranged in outer regions of the conductive base layer according to a further embodiment.

FIG. 10a shows a schematic side view of the stiffening sections 24a and 24b being arranged in the outer regions 43a and 43b of the conductive base layer 22. The soft region 34a is arranged at the inner region 41. The stiffening section 24a is arranged at the outer region 43a of the conductive base layer 22. The stiffening section 24b is arranged at the outer region 43b.

Figure 10B:
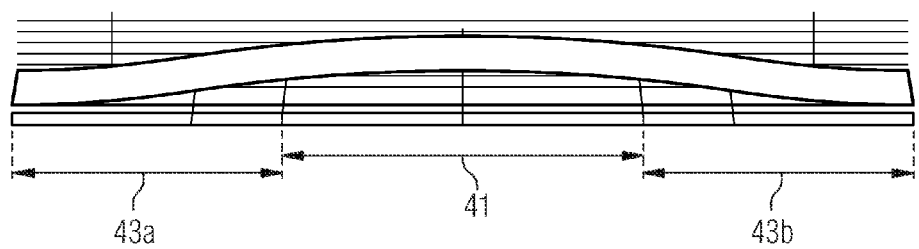
FIG. 10b shows a schematic perspective view of a simulation result simulating a deflection of the functional region of FIG. 10a according to a further embodiment.

FIG. 10b shows a schematic perspective view of a simulation result simulating a deflection of the functional region 16 of FIG. 10a. A bending curve of the functional region 16 is flattened at the outer regions 43a and 43b based on the stiffening sections 24a and 24b. The stiffening sections 24a and 24b may result in a reduced deflection of the functional regions at regions adjacent to the clamped regions.

This may result in reduced mechanical stress at boundary points where the substrate 12 ends to clamp the functional region. Damages of the functional region 16, the functional structure 14, respectively, due to the mechanical stress may be reduced.

A length of the functional structure 16 may be, for example, more than 50 µm, more than 100 µm or more than 200 µm, wherein the length is formed by the inner region 41 and the outer regions 43a and 43b. A total thickness of the functional structure may be, for example, in a range between 100 nm and 2 cm, 1 µm and 1 cm, or between 2 µm and 10 µm, or any other value. An amplitude of deflection of the cantilevered beam may comprise, for example, a value of the more than 10 µm, more than 50 µm or more than 100 µm.

A locally stiffed functional structure may allow for a locally insertion or induction of mechanical stress into the functional structure, for example, in a buckling structure such as a buckling plate of a loudspeaker. Alternatively or in addition, a local stiffening may be obtained.

Figure 11:
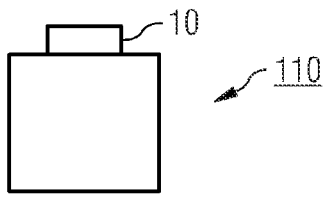
FIG. 11 shows a schematic block diagram of a micro mechanical sound transducer, comprising the micro mechanical structure described in FIG. 1 according to a further embodiment.

FIG. 11 shows a schematic block diagram of a micro mechanical sound transducer 110, wherein the micro mechanical sound transducer 110 comprises the micro mechanical structure 10. The micro mechanical sound transducer 110 may be configured to sense variations in an ambient pressure, such as a sound pressure level. The variations in the sound pressure level may enable the functional region of the micro mechanical structure 10 to deflect. Thus, the functional region may be deflectable responsive to the sound pressure level. For example, an electrostatic field may be arranged between the functional region and the substrate or a back plate electrode arranged at the micro mechanical structure 10. A deflection of the functional region may lead to a varying charge and/or voltage sensible between the functional region and the substrate, the back plate electrode respectively.

Alternatively, the micro mechanical sound transducer 110 may be configured to apply a force at the functional region, for example, by applying an electrostatic or electrodynamic electrical field such that the functional region deflects based on the electrostatic or electrodynamic field such that sound may be emitted by the micro mechanical sound transducer 110. The micro mechanical sound transducer 110 may thus be configured to operate as a microphone or as a loudspeaker.

Alternatively or in addition, the micro mechanical sound transducer may comprise a micro mechanical structure 60, 70, 75 or 80.

FIG. 12 shows a schematic flow chart of a method 1000 for fabricating a micro mechanical structure. The method 1000 comprises a step 1100 in which a substrate is provided. The method 1000 further comprises a step 1200 in which a functional structure with a conductive base layer having a conductive base layer material is arranged at the substrate such that the functional structure is deflectable in a functional region with respect to the substrate responsive to a force acting on the functional region.

The method 1000 further comprises a step 1300 in which a carbon material is implanted sectionally into the conductive base layer material in a stiffening section such that a carbon concentration of the carbon material in the conductive base layer material is at least $10^{14}$ per cubic cm and at least higher by a factor of 1000 than in a material of the conductive base layer material adjacent to the stiffening section.

The method 1000 further comprises an optional step 1400 in which the conductive base layer material is annealed after implanting the carbon material, i.e., after the step 1300.

The implanting may be executed such that the conductive base layer material in the stiffening section comprises a hardness that is at least higher by a factor of 1.5 than a hardness of the conductive base layer material adjacent to the stiffening section.

The step 1300 may be repeated and adapted such that in a repetition of the step 1300 the same is executed such that an oxygen and/or a nitrogen material is implanted into the conductive base layer material. A concentration of a stiffening material comprising the carbon material and optionally the oxygen material and/or the nitrogen material may be between $10^{14}$ and $10^{24}$ particles per cubic cm, between $10^{15}$ and $10^{22}$ particles per cubic cm or between $10^{16}$ and $10^{20}$ particles per cubic cm.

The step 1300 may be executed by utilizing an ion beam. For example, ions comprising the carbon material may be accelerated by an electrical field such that the ions may travel towards the conductive base layer material. An implantation voltage for accelerating the ions may be greater than or equal to 10 kV and less than or equal to 200 kV, greater than or equal to 15 kV and less than or equal to 180 kV, greater than or equal to 20 kV and less than or equal to 150 kV or may comprise any other value.

The ion beam may impinge on the conductive base layer with an angle between 0° and 90° with respect to a normal direction of a main surface of the conductive base layer.

Alternatively, the ion beam may comprise an implantation angle of less than or equal to 60°, 45° or less than or equal to 20°.

The step 1200 may comprise a manufacturing of the functional structure on the substrate by applying one of a physical vapor deposition, a chemical vapor deposition process, an epitaxial growth process and/or a variation or a combination thereof to manufacture the conductive base layer.

In other words, using conductive base layers comprising stiffening sections as they are described may allow for increasing the resistance and/or the stability of conductive detached structures, such as, for example, membranes or bending beams. Additionally, an improvement of anti-sticking characteristics (caused by the lower wettability of carbon) may be achieved, which may, among other things, result in different, novel and easier setups of the entire device. This may allow for sparing further protective layers such as silicon nitride (SNIT) or intermediate oxide layers.

Decisive mechanical material parameters of layers, such as, for example, the hardness and the modules of elasticity (Young's Modulus) may be optimized by introducing carbon (C) into silicon (Si). The mechanical stressability (pressure, temperature, . . . ) thereof may improve considerably when using this composite as a part of a free-standing layer. There are several ways of applying Si—C compounds as a material. By additionally and specifically adding oxygen (O), nitrogen (N) and/or any combinations of these materials, obtained composites may allow for additional degrees of freedom when configuring the mechanical characteristics such as layer stress, Young's Modulus and the like.

Electromechanical characteristics of the functional structure may be improved over a very wide range by introducing other materials, such as, for example, tantalum, molybdenum, titan and/or tertiary compounds or the like and/or by coating the functional structure for example, a poly-Si membrane, by the material systems mentioned.

The stiffening section comprising may exhibit a reduced affinity to wetting compared to pure silicon. This may allow for a reduced device sticking that may occur when the functional structure engages with the substrate. Also, sticking effects may be reduced that may occur during etching processes. Thus, one advantage is the marked increase in the mechanical stressability at reduced membrane thickness. Alternatively or in addition the increased hardness allows for an increased abrasive resistance, an increased breaking strength and/or an increased electrical capacity of conductive structures.

The mechanical characteristics can be optimized by implanting C—O—N and, subsequently, annealing. The amount of carbon can be dosed very well and the penetration depth be adjusted by means of implantation. Additionally, the C—O—N-implanted poly Si layer (currently phosphorous-doped) is expected to remain conductive and to be integrated ideally into the existing process of manufacturing.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A micro mechanical structure comprising:
a substrate; and
a functional structure arranged at the substrate;
wherein the functional structure comprises a functional region which is deflectable with respect to the substrate responsive to a force acting on the functional region;
wherein the functional structure comprises a conductive base layer having a conductive base layer material; and
wherein the conductive base layer material comprises sectionally in a stiffening section a carbon material such that a carbon concentration of the carbon material in the conductive base layer material is at least $10^{14}$ particles per cm³ and at least higher by a factor of 10³ than in the conductive base layer material adjacent to the stiffening section.

2. The micro mechanical structure according to claim 1, wherein the conductive base layer material in the stiffening section comprises a hardness that is at least higher by a factor of 1.5 than a hardness of the conductive base layer material adjacent to the stiffening section.

3. The micro mechanical structure according to claim 1, wherein the stiffening section is an integral part of the conductive base layer such that the stiffening section has the same thickness as the conductive base layer adjacent to the stiffening section within a tolerance range.

4. The micro mechanical structure according to claim 1, wherein the conductive base layer material additionally comprises in the stiffening section at least one of a nitrogen material and an oxygen material with a respective material concentration.

5. The micro mechanical structure according to claim 1, wherein an average concentration of a stiffening material in the stiffening section, the stiffening material comprising the carbon material and optionally one of an oxygen material and a nitrogen material is between $10^{14}$ and $10^{24}$ particles per cm³.

6. The micro mechanical structure according to claim 1, wherein a base area of the stiffening section comprises at least a part of a circular shape, a ring shape, a star shape, a polygon shape, an elliptical shape, a honeycomb structured shape or a combination thereof.

7. The micro mechanical structure according to claim 1, wherein an average concentration of the carbon material in the conductive base layer material varies within the functional structure to achieve a resulting stiffening profile in the functional structure.

8. The micro mechanical structure according to claim 1, wherein the conductive base layer comprises a plurality of functional sections.

9. The micro mechanical structure according to claim 8, wherein an average concentration of the carbon material in the conductive base layer material varies within the plurality of functional sections to achieve a resulting stiffening profile in a stiffening region comprising the plurality of functional sections.

10. The micro mechanical structure according to claim 1, wherein the functional structure is a membrane structure and wherein the micro mechanical structure is part of a sound transducer structure.

11. The micro mechanical structure according to claim 1, wherein the functional structure is a bending beam structure comprising a cantilevered portion and the deflectable functional region.

12. The micro mechanical structure according to claim 1, wherein the functional region is arranged at abutting portions of the functional structure and configured to abut against the substrate when the functional region deflects.

13. The micro mechanical structure according to claim 1, wherein the functional region is configured to set sound transducing characteristics of the micro mechanical structure.

14. The micro mechanical structure according to claim 1, wherein the conductive base layer comprises a silicon material.

15. The micro mechanical structure according to claim 1, wherein an average concentration of the carbon material within the conductive base layer varies along a thickness direction of the functional structure.

16. A micro mechanical sound transducer comprising a micro mechanical structure according to claim 1.

17. The micro mechanical sound transducer according to claim 16, wherein the micro mechanical sound transducer is a microphone.

18. The micro mechanical sound transducer according to claim 16, wherein the micro mechanical sound transducer is a loudspeaker.

19. A method for fabricating a micro mechanical structure comprising:
providing a substrate;
arranging a functional structure with a conductive base layer having a conductive base layer material at the substrate such that the functional structure is deflectable in a functional region with respect to the substrate responsive to a force acting on the functional region; and
implanting sectionally into the conductive base layer material in a stiffening section a carbon material such that a carbon concentration of the carbon material in the conductive base layer material is at least $10^{14}$ per cm³ and at least higher by a factor of 10³ than in a material of the conductive base layer material adjacent to the stiffening section.

20. The method according to claim 19, wherein the implanting is executed such that the conductive base layer material in the stiffening section comprises a hardness that is at least higher by a factor of 1.5 than a hardness of the conductive base layer material adjacent to the stiffening section.

21. The method according to claim 19, further comprising annealing the conductive base layer material after implanting the carbon material.

22. The method according to claim 19, further comprising implanting sectionally into the conductive base layer material at the stiffening section one of a nitrogen material and an oxygen material.

23. The method according to claim 19, wherein an average concentration of implanted particles of an implanted material that is implanted during implantation, the implanted material comprising the carbon material and optionally one of an oxygen material and a nitrogen material, is between $10^{14}$ and $10^{24}$ particles per cm³.

24. The method according to claim 19, wherein the implantation is executed with an implantation voltage of greater than or equal 10 kV and less than or equal 200 kV.

25. The method according to claim 19, wherein during the implantation, implanted particles are implanted into the conductive base layer material along an implantation angle of less than or equal 45° with respect to a normal direction of a main surface of the conductive base layer.

26. The method according to claim 19, wherein arranging the functional structure comprises manufacturing the functional structure on the substrate by applying one of a physical vapor deposition, a chemical vapor deposition process or an epitaxial growth process to manufacture the conductive base layer.

* * * * *